United States Patent
Thomas et al.

(10) Patent No.: US 6,956,511 B2
(45) Date of Patent: Oct. 18, 2005

(54) MULTI-SYMBOL/COEFFICIENT DECODE OPERATION FOR HUFFMAN CODES

(75) Inventors: Renjit T. Thomas, Vancouver, WA (US); Louis J. Kerofsky, Portland, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/961,453

(22) Filed: Oct. 7, 2004

(65) Prior Publication Data

US 2005/0146450 A1    Jul. 7, 2005

Related U.S. Application Data

(60) Provisional application No. 60/535,191, filed on Jan. 6, 2004.

(51) Int. Cl.[7] ............................................. H03M 7/40
(52) U.S. Cl. ..................... 341/67; 341/65; 341/106; 382/233; 382/246; 382/250
(58) Field of Search ........................... 341/65, 67, 106; 382/233, 246, 250

(56) References Cited

U.S. PATENT DOCUMENTS

| | | | |
|---|---|---|---|
| 5,225,832 A | | 7/1993 | Wang et al. |
| 5,253,053 A | * | 10/1993 | Chu et al. .............. 375/240.23 |
| 5,254,991 A | | 10/1993 | Ruetz et al. |
| 5,398,027 A | * | 3/1995 | Ooi ............................ 341/67 |
| 5,491,480 A | | 2/1996 | Jan et al. |
| 5,646,618 A | * | 7/1997 | Walsh ......................... 341/67 |
| 5,650,905 A | | 7/1997 | Bakhmutsky |
| 5,652,582 A | | 7/1997 | Truong et al. |
| 5,757,295 A | | 5/1998 | Bakhmutsky |
| 5,784,631 A | | 7/1998 | Wise |
| 5,798,719 A | | 8/1998 | Wise et al. |
| 5,818,364 A | | 10/1998 | Hintzman et al. |
| 5,825,312 A | | 10/1998 | D'Ortenzio |
| 5,841,380 A | | 11/1998 | Sita et al. |
| 5,841,381 A | | 11/1998 | Nakayama |
| 6,008,745 A | * | 12/1999 | Zandi et al. ................. 341/67 |
| 6,043,765 A | | 3/2000 | Twardowski |
| 6,121,905 A | | 9/2000 | Redford |
| 6,130,631 A | | 10/2000 | Redford |
| 6,147,629 A | * | 11/2000 | Wood .......................... 341/67 |
| 6,219,457 B1 | * | 4/2001 | Potu ........................... 382/246 |
| 6,252,992 B1 | * | 6/2001 | Ishikawa .................... 382/239 |
| 6,373,412 B1 | * | 4/2002 | Mitchell et al. .............. 341/65 |
| 6,518,896 B1 | * | 2/2003 | Luna et al. ................. 341/106 |
| 6,563,442 B1 | * | 5/2003 | Luna et al. ................. 341/106 |
| 6,690,307 B2 | * | 2/2004 | Karczewicz ................. 341/67 |
| 6,771,824 B1 | * | 8/2004 | Chiu et al. .................. 382/233 |

FOREIGN PATENT DOCUMENTS

| | | |
|---|---|---|
| EP | 0814614 | 11/1997 |
| WO | WO99/59105 | 11/1999 |
| WO | WO99/59330 | 11/1999 |

* cited by examiner

*Primary Examiner*—Michael Tokar
*Assistant Examiner*—Khai Nguyen
(74) *Attorney, Agent, or Firm*—Marger Johnson & McCollom, P.C.

(57) ABSTRACT

Method and apparatus for use in Huffman decoding are described. In exemplary systems, a JPEG Huffman decoder is capable of simultaneously decoding multiple coefficients and/or symbols in a single table lookup. Methods for designing, building, and using such a table are included. Other embodiments are described and claimed.

27 Claims, 1 Drawing Sheet

Fig. 1

＃ MULTI-SYMBOL/COEFFICIENT DECODE OPERATION FOR HUFFMAN CODES

This application claims priority from U.S. provisional patent application Ser. No. 60/535,191 filed Jan. 6, 2004, and having the same title. The '191 application is incorporated herein in its entirety.

FIELD OF THE INVENTION

The present invention relates generally to Huffman coding, and more particularly to a Huffman decoding procedure useful in decompression of JPEG, MPEG, and similarly-encoded data.

BACKGROUND

As used in the following discussion, the terms "Huffman code," "symbol," and "coefficient" have the following meanings. A "Huffman code" is used herein to refer to a Variable-Length Code (VLC). A "symbol" is a unit of information coded with, e.g., Huffman coding. A "coefficient" is the final, typically numerical, value of interest that is related to the symbol. For example, decoding a JPEG (Joint Picture Expert Group) Huffman code provides a symbol with information as to the bits required to represent a coefficient and implicit information as to the sign of the coefficient. Based on an interpretation of the symbol, a few additional bits are read from a bit stream and then a coefficient can be reconstructed.

JPEG is a widely used image compression standard. JPEG compresses an image by splitting the raw data into components, dividing each component into eight-pixel by eight-pixel blocks, applying a Discrete Cosine transform (DCT) to each block, quantizing the block coefficients, run-length encoding the coefficients in zigzag order, and finally Huffman-encoding symbols related to the run-lengths and non-zero coefficients.

JPEG decompression reverses these steps to restore the original image (minus quantization errors). In a typical decompression, 30% of the time is spent decoding the Huffman coding, another 30% is spent on inverse DCTs, and the remainder of the time is spent parsing, moving data, performing color transforms, etc. Many common microprocessors and signal processors contain optimizations to speed DCT and inverse DCT operations, thus further reducing the impact of these operations.

In many cases where the image is decompressed for viewing on a display, the actual image size is much larger than the final display size. For example, the display may just contain 640×480 pixels, while the actual image size may be 2560×1920 pixels (taken by a 5 megapixel camera, for instance). In this case, a technique applied (not part of this disclosure) is to do a reduced IDCT (two pixel by two pixel IDCT in this case) instead of the full IDCT, reducing IDCT complexity in this example by roughly a factor of sixteen. All subsequent data moves and color transforms are done on the basis of this reduced block size, resulting in similar saving for those operations as well. Note that the Huffman decoding is done before the IDCT; hence it has to be done fully no matter what the final display resolution. It is not possible to skip the decoding of higher coefficients since it is impossible to know where the next block's symbols start, without decoding all of the coefficients in the current block.

In a case where the display size is smaller than the image size, since the IDCT and subsequent modules have been modified to skip some processing, the percentage of time spent in the Huffman module increases, as compared to the other modules. For example, for decoding using the two by two IDCT, 60–80% of the decompression time is spent in Huffman decoding. This is especially true for images with high quality, as is the case with digital cameras with high resolution. Hence it becomes an important issue to speed up the Huffman decoding.

As explained above, JPEG compression operates on eight-pixel by eight-pixel blocks. The DCT coefficients from each block are zigzag scanned into a one-dimensional array, and these are run-length encoded. The run and level are assigned a Huffman Variable Length Code as explained in Section F of the JPEG standard (CCITT Recommendation T.81). The Huffman table is indicated in the JPEG bit stream in a particular format. Huffman tables are specified in terms of a sixteen-element list giving the number of codes for each code length from one to sixteen. This is followed by a list of eight-bit symbol values, each of which is assigned a Huffman code. The symbol values are placed in the list in order of increasing code length. Code lengths greater than sixteen bits are not allowed, as explained in section C of the JPEG standard. Symbols have different meanings, depending on whether a coefficient is an AC or a DC value.

Each JPEG block has one DC coefficient, which is differentially coded. The remaining 63 (AC) coefficients are arranged linearly in zigzag scan order. Also, from the symbol itself only partial coefficient information is available; a certain number of following bits will have to be read from the bit stream in order to refine the coefficient and determine its sign. When a run of more than fifteen zeros occurs in the AC coefficients, this condition is coded with a special escape sequence. It is also possible to terminate a block with a special symbol called End of Block (EOB) when a run of zeros continues to the end of the block. These nuances complicate and slow the serial Huffman decoding procedure in JPEG.

It is possible to traverse a symbol tree bit-by-bit to perform Huffman decoding, but this requires a decision per bit decoded and is usually inefficient. Instead, it has been observed that most of the time the symbols have a length less than seven or eight bits. Hence it is common to have a lookup table for symbol-lookup. Given a length L, all Huffman codes of length L or less are decoded with a single table access. When a code has a length greater than L, additional decoding operations are needed. Also, since the retrieval of the actual coefficient involves many arithmetic operations, it is common to maintain a bit buffer (denoted hence forth as "bit_buffer"). All the lookup, indexing, and arithmetic operations are performed on this bit_buffer register. Normally this register is chosen to be the widest register in the processor. Also, for efficient input-output, it is typical to have a byte-buffer (typically a few kilobytes) that keeps a portion of the compressed stream in memory. When enough bit_buffer bits are not available for lookup of the next symbol, bytes are transferred from this byte-buffer to the bit_buffer. Every time this happens, the maximum possible number of bytes is transferred to minimize the number of such transfers.

A simple example will now be presented for decoding a single Huffman codeword using a standard lookup table technique. To keep the example brief, only three symbols (0, +1, −1) are used, and are assigned the respective codewords 1, 01, and 00, as shown in Table 1 below.

TABLE 1

| Codeword | Symbol |
|----------|--------|
| 1 | 0 |
| 01 | +1 |
| 00 | −1 |

Using a look-ahead value of two bits, the next symbol can be decoded from the bit_buffer by extracting the next two bits and looking up a symbol from the following lookup table (Table 2):

TABLE 2

| Look-ahead Value | Code Length | Symbol |
|------------------|-------------|--------|
| 00 | 2 | −1 |
| 01 | 2 | +1 |
| 10 | 1 | 0 |
| 11 | 1 | 0 |

The Code Length column in Table 2 tells the algorithm how many bit_buffer bits were consumed in looking up the next symbol. During decoding, the bit buffer is shifted by this many bits after a symbol lookup, and then the next symbol is looked up. This process is illustrated in Table 3 below, for an example bit stream and initial bit_buffer content [10010101101] containing seven symbols:

TABLE 3

| Bit_buffer | 10010101101 | 0010101101 | 10101101 | 0101101 | 01101 | 101 | 01 |
|------------|-------------|------------|----------|---------|-------|-----|-----|
| Look ahead | 10 | 00 | 10 | 01 | 01 | 10 | 01 |
| Code Length | 1 | 2 | 1 | 2 | 2 | 1 | 2 |
| Symbol | 0 | −1 | 0 | +1 | +1 | 0 | +1 |

Although this simple concept is still applicable, actual JPEG Huffman decoding is more complex due to the special coding and code situations previously described. Algorithms for traditional AC-coefficient Huffman table creation and use are now presented.

exemplary VLC code, e.g. 0100 for symbol s, all the elements of the table corresponding to indices 0100xxxx will map to symbol s and length 4, where "x" denotes either a 0 or 1 bit. To make the table creation fast, it is traditional to use the following algorithm.

Assume that the symbol lookup uses a constant HUFF_LOOKAHEAD number of bits. look_sym is a table that gives the symbol contained in the lookup bits; look_nbits is a table that tells how many bits are used by the symbol. If a particular look_nbits entry is not positive, the corresponding symbol is of a length more than HUFF_LOOKAHEAD bits. Huffcode[x] denotes the Huffinan code for a left-justified bit sequence denoted in binary by x. bits[x] denotes the number of codes with length x. Huffval[x] denotes the symbol associated with the binary code. The bottom four bits of this symbol denote the run and the top four bits denote a parameter from which the level can be derived. This particular meaning is for AC coefficients, and a different meaning applies to DC symbols. Note that the Huffval array contains the symbols, arranged in ascending order of the corresponding VLC code. Look_nbits is initialized to zero at the beginning. "<<" denotes Left shift operation. The lookup table creation is as follows.

```
p = 0;
for (l = 1; l <= HUFF_LOOKAHEAD; l = l+1)
{
    for (i = 1; i <= bits[l]; i = i+1, p = p+1)
    {
        lookbits = huffcode[p] << (HUFF_LOOKAHEAD − l);
        for (ctr = 1 << (HUFF_LOOKAHEAD − l); ctr > 0; ctr = ctr−1)
        {
            look_nbits[lookbits] = l;
            look_sym[lookbits] = huffval[p];
            lookbits = lookbits + 1;
        }
    }
}
```

In essence, the algorithms work as follows. The lookup table contains an entry for each possible eight-bit binary value that could be read from the bit stream. For an With a lookup table set up by this algorithm, JPEG AC coefficient decoding can be illustrated by the following algorithm. Note that tree parsing must be used for the cases where the table lookup cannot produce a symbol. The tree parsing portion of the code is not relevant to this disclosure, but is understood by those skilled in the art and is therefore omitted.

```
for(k = 1; k < 64; k = k+1)
{
    Ensure there are at least HUFF_LOOKAHEAD bits in the bit_buffer;
    index = first HUFF_LOOKAHEAD bits in bit_buffer;
    x = look_nbits[index];
    if (x <= 0) {do tree parsing; then continue the loop.};
    s = look_sym[index];
    Remove x bits from bit_buffer;
    /* Get top 4 bits in r, bottom 4 bits in s */
    if(s > 0)
    {
        k = k + r;
        Ensure there are at least s bits in the bit_buffer;
        Get the next s bits from bit_buffer, place in r;
```

One of ordinary skill in the art will recognize that the concepts taught herein can be tailored to a particular application in many other advantageous ways. In particular, those skilled in the art will recognize that the illustrated embodiments are selected from many alternative implementations that will become apparent upon reading this disclosure. Although specific JPEG and MPEG examples have been presented, the concepts described herein are applicable to other variable-length coding schemes and data sets. Such minor modifications are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

```
        s = HUFF_EXTEND(r, s);
        block[k]=s;
    }
    else
    {
        if(r != 15)
        {
            /* We have reached End of block; exit the module. */
        }
        else
        {
            /* This is an escape sequence for run of 15; hence k = k + 15; */
        }
    }
}
```

In this algorithm, the function y=HUFF_EXTEND(r, s) is defined as follows:

```
    if ( r < (1<<(s − 1))
    {
        y = r + ((−1)<<s) + 1;
```

-continued

```
    }
    else
    {
        y = r;
    }
```

Further details are also available in the JPEG standard.

BRIEF DESCRIPTION OF THE DRAWING

The embodiments may be best understood by reading the disclosure with reference to the drawing, wherein.

DETAILED DESCRIPTION OF THE EMBODIMENTS

Huffman decoding is a significant module in JPEG decompression. The percentage of time spent in Huffman decoding can be significantly higher than the time spent in all other JPEG modules combined, particularly when the image to be decoded has a large size and/or high quality and the required final display is of much smaller size. Traditional Huffman decoding is done as a tree traverse. Since many of the Huffman codes occurring in JPEG files are of a size less than 8 bits, typically, lookup tables are used as described in the background to decode symbols, one symbol at a time per table access. The symbols typically give the number of bits to be read next to decode coefficients, and implicit information as to the sign of coefficients. The meaning of symbols is different for DC coefficients and AC coefficients.

In the algorithm presented in the background, a symbol was first obtained, and then based on the symbol additional bits were obtained in order to arrive at a final coefficient value. In many cases, particularly for larger values of HUFF_LOOKAHEAD, both the bits for the symbol and the additional bits for the coefficient are contained in a single look ahead grouping of bits. It has been empirically determined for one image set, for example, that a look ahead of eight bits will contain both a symbol and the additional bits needed to decode a coefficient 78% of time. 19% of the remaining time, at least the bits for one symbol lie in the look ahead and can be decoded in a table lookup. When the look-ahead size increases to 11 bits, it has been determined that at least one full coefficient can be decoded from the single look-ahead 87.5% of the time. The example images used to arrive at these statistics were typical images taken with very high quality using a 5-mega pixel digital camera. Note that this case denotes one of the most difficult cases of image decoding.

Since it has now been observed that the percentage of time that a complete coefficient recovery from the bit_buffer is relatively large, whether a second symbol could also be obtained from various values of HUFF_LOOKAHEAD bits was also investigated. Using typical images and various bit buffer and look ahead sizes, it was further concluded that it is often feasible to obtain one complete coefficient and a second symbol with a single lookup. With suitable buffer sizes, it even became possible to often obtain two complete coefficients from a single lookup.

Using a 5-mega pixel JPEG image data set, it was determined that with an 11-bit look up table, 44% of the time two entire coefficients can be decoded with a single lookup, 18% of the time one full coefficient and one symbol can be decoded with a single lookup, 22% of the time one full coefficient can be decoded, and 15% of the time one symbol can be decoded; thus only 0.6% of the time the look ahead does not contain a full symbol and fall back decoding must be used. With a look ahead of 8 bits, 21% of the time two coefficients can be decoded simultaneously, one full coefficient and one symbol can be decoded together 16% of the time, only one complete coefficient can be decoded 36% of the time, and one symbol only about 24% of the time. These results are summarized in Table 4 below.

TABLE 4

| Data decoded with one lookup | Look ahead = 11 bits | Look ahead = 8 bits |
|---|---|---|
| 2 coefficients | 44% | 21% |
| 1 coefficient and 1 symbol | 18% | 16% |
| 1 coefficient | 22% | 36% |
| 1 symbol | 15% | 24% |
| Other cases (tree parse etc) | 0.6% | 3% |

Thus, as the number of look ahead bits increases, the percentage of time that two coefficients can be directly obtained from the bit_buffer increases. However, note that the depletion of bits from the bit_buffer is also increased now, compared to the traditional case. In other words, the number of times the bit_buffer is filled (as explained earlier, the bit buffer is filled when there are not sufficient bits in the buffer for lookup or for data refining) may increase compared to the number of coefficients decoded. The re-filling of bit_buffer can be an expensive operation on some processors, and thus the ratio of calls to this process over the coefficients decoded is preferably minimized. On such processors, it may not make sense to increase the look-ahead bits beyond a certain point. For instance, on one system it was found that the overall performance was best for a look ahead of nine bits when the bit_buffer was a 32-bit register. However, if a wider register for bit_buffer were available, for example 64 bits, then the depletion of the bit_buffer is reduced for each lookup, and there is a higher probability of two (or even more in some embodiments) coefficients being decoded directly in a single lookup. For a 64-bit bit_buffer register, the overall performance for one sample set was best for 11 bits. If wider registers are available, then bigger look ahead bit values can be selected and potentially more coefficients can be decoded in a single lookup.

Assume that tables have been created for multiple symbol/coefficient recovery from indices. The creation of this table is discussed in a later section. In the present decoding procedure the tables are intentionally created so that the tables can be indexed with a bit pattern and the following quantities can be returned:

(a) A value quantifying how much data can be decoded directly from the supplied bit pattern. This is denoted in the subsequent algorithms as "stopindex."

(b) The run of the first coefficient, denoted as "runs1."

(c) The first complete coefficient, denoted as "coefficient1." Note that if the first complete coefficient cannot be obtained without more bits, "coefficient1" can also denote the symbol from which the coefficient can be retrieved.

(d) The run of the second coefficient, denoted as "runs2."

(e) The second complete coefficient, denoted as "coefficient2." Note that if the second complete coefficient cannot be obtained without more bits "coefficient2" can also denote the symbol from which the second coefficient can be retrieved.

(f) The number of bits that can be removed from bit_buffer, denoted as "bits1."

(g) A correction to bits1 in the case where decoding past the first coefficient overruns the end of a block, denoted by "bits2."

The decoding is described as below.

```
k = 0;
Loop:
If (k > 62) done;
Ensure there are at least HUFF_LOOKAHEAD bits in the bit_buffer;
index = first HUFF_LOOKAHEAD bits in bit_buffer;
x = stopindex [index];
if (x == 5)
{
    Remove bits1[index] from bit_buffer;
    k = k + runs1[index];
    Block[k] = coefficient1[index]
    If (k > 62)
    {
        Undo the removal of bits2[index] to the bit buffer;
        Done;
    }
    else
    {
        k = k + runs2[index];
        Block[k] = coefficient2[index];
    }
}
else
{
    if (x == 4)
    {
        Remove bits1[index] from bit_buffer;
        k = k + runs1[index];
        Block[k] = coefficient1[index];
        If (k > 62)
        {
            Undo the removal of bits2[index] to the bit buffer;
            Done;
        }
        else
        {
            r = runs2[index];
            s = coefficient2[index];
            if(s>0)
            {
                k=k+r
                Ensure there are at least s bits in the bit_buffer
                Get the next s bits in r
                s = HUFF_EXTEND(r, s);
                block[k]=s;
            }
            else
            {
                if(r != 16)
                {
                    We have reached End of block; exit the module;
                }
                else
                {
                    an escape sequence for run of 15; k = k + 16;
                }
            }
        }
    }
    else
    {
        if(x == 3)
            Decode one coefficient fully (similar as in case of x==5);
    }
    else
    {
        if (x==2)
            Decode one symbol;
            refine the symbol to a coefficient in the traditional way.
    }
    else
    {
        Do tree parsing. Continue the loop.
    }
}
Goto Loop:
```

In the above method, there are in effect many tables that might be used for a particular group of look ahead bits: stopindex[ ] denotes whether using this group of look ahead bits two coefficients can be decoded, one coefficient and a following symbol can be decoded, etc. Stopindex[ ] has the following values in this implementation:

(a) 5 means two coefficients can be decoded
(b) 4 means one coefficient and one symbol can be decoded
(c) 3 means one coefficient can be decoded
(d) 2 means one symbol can be decoded (this collapses to the traditional lookup case)
(e) other values denote that tree parsing needs to be done Note that for very high quality images, a case can exist where the zigzag index is nearing the end of a block, without having an EOB (End of block) symbol as such. In this case it is extremely important to check whether the block index has overshot. Since in JPEG a number of blocks are coded together, an overshoot error may propagate very widely. Thus if k has reached the end of block after one coefficient is decoded but a second coefficient or symbol has inadvertently been decoded, the bit stream must be "backed up." This is achieved using the value of "bits2[ ]."

The case for a stopindex of x=3 is similar to case of x=5 without the potential second coefficient, hence it is omitted for brevity of the disclosure. The case for a stopindex of x=2 is similar to the traditional method and is not repeated here.

Thus in essence the algorithm obtains a look ahead of HUFF_LOOKAHEAD bits and determines whether two coefficients can be decoded directly. If so, two values and runs are decoded directly and the required number of bits are removed from the bit buffer. If, after getting the first run, the end of block has been reached, an appropriate number of bits have to be pushed back to the buffer. Also, when two coefficients cannot be decoded directly, the algorithm may still be able to decode one full coefficient and one symbol. In this case, the same check on the block index is performed. Otherwise, the algorithm retrieves one full coefficient if possible, and if not, reverts back to traditional methods.

Note that the exact implementation of the above is highly dependent on the system processor. In some embodiments all the above tables are collapsed into one table of structures with the bits1, runs1, bits2, runs, coefficient1, coefficient2, etc. all becoming fields of the above structure. This may be an important consideration since the addressing of different tables and their caching is costly in some processors. Such implementation details are largely omitted here.

The tables used in the decoding process above can be created as follows. The "Stopindex[ ]" and "bits2[ ]" arrays are initialized to 0. Assume that the tables are implemented in a common structure, whose members are bits1, runs1, bits2, runs2, coefficient1, and coefficient2 as explained before. With that, "sectable[ ]" is the modified lookup table, which is an array of these structures, the total array being of size $2^{HUFF\_LOOKAHEAD}$. The variable "sectable" denotes the address of the start of the table. A notation of "lxptr=sectable+4" means lxptr now holds the address of sectable, incremented by 4. In the C-like pseudo-algorithm given below, "A->B" means member B of the structure, whose address is A. "*A" means the entry at address A. "x++" means increment x by 1. "y—" means decrement y by 1. ">>" denotes right shift and "<<" denotes left shift. The labels "E1, E2, etc." are used for solely for clarity in referring to parts of the algorithm in the following description.

```
for (l = 1; l <= HUFF_LOOKAHEAD; l++)
{
    for (i = 1; i <= bits[l]; i++, p++)
    {
        lookbits = huffcode[p] << (HUFF_LOOKAHEAD – l);
        lx1ptr = sectable + lookbits;
        stopindexptr = stopindex + lookbits;
E1.     for (rawbits = 0; rawbits < 1 << (HUFF_LOOKAHEAD-l); rawbits++)
        {
E2.         lx1ptr->bits1 = l;
            s = huffval[p];
            r = s >> 4;
            lx1ptr->runs1 = r + 1;
            saved_run = r;
            s &= 15;
            *stopindexptr = 2;
E3.         lx1ptr-> coefficient1 = s;
            temp = l + s;
E4.         if (s>0)
            {
E5.             if (0 <= (HUFF_LOOKAHEAD – temp))
                {
E6.                 lx1ptr->bits1 = temp;
                    r =(( (rawbits >> (HUFF_LOOKAHEAD
                                    -temp))) & ((1<<(s))-1));
                    rem_length = HUFF_LOOKAHEAD – temp;
                    s = HUFF_EXTEND(r, s);
                    *stopindexptr = 3;
E7.                 lx1ptr-> coefficient1 = s;
E8.                 saved_lx1ptr = lx1ptr;
E9.                 saved_stopindexptr = stopindexptr;
E10.                for (l2 = 1; l2 <= rem_length; l2++)
                    {
                        for (ctr2 = 1 << (rem_length-l2); ctr2 > 0; ctr2--)
                        {
                            lx1ptr++;
                            stopindexptr++;
```

```
                      1x1ptr->bits1 =
                          HUFF_LOOKAHEAD - rem_length;
                      *stopindexptr = 3;
                      1x1ptr->runs1 = saved_run + l;
                      1x1ptr->coefficient1 = s;
                  }
              }
E11.          rawbits += (1 << (rem_length)) - 1;
              p2 = 0;
E12.          for (l2 = 1; l2 <= rem_length; l2++)
              {
E13.              for (i2 = 1; i2 <= bits[l2]; i2++, p2++)
                  {
E14.                  lookbits2 =
                          huffcode[p2] << (rem_length - l2);
                      1x1ptr2=saved_1x1ptr+lookbits2;
E15.                  stopindexptr2 = saved_stopindexptr
                                      + lookbits2;
E16.                  for (rawbits2 = 0;
                           rawbits2 < 1 << (rem_length - l2);
                           rawbits2++)
                      {
E17.                      s = huffval[p2];
                          r = s >> 4;
                          1x1ptr2->runs2 = r + 1;
                          s &= 15;
                          *stopindexptr2 = 4;
                          1x1ptr2->coefficient2 = s;
                          1x1ptr2->bits1 = l2
                              + HUFF_LOOKAHEAD
                              - rem_length;
E18.                      1x1ptr2->bits2 = l2;
                          temp =l2 + s;
E19.                      if (s > 0)
                          {
E20.                          if (0 <= (rem_length - temp))
                              {
E21.                              r = ((( rawbits2 >> (rem_length
                                              - temp)))
                                          & ((1<<(s)) - 1));
                                  1x1ptr2->bits1 =
                                      HUFF_LOOKAHEAD
                                      - rem_length + temp;
                                  1x1ptr2->bits2 = temp;
                                  s = HUFF_EXTEND(r, s);
                                  *stopindexptr2 = 5;
E22.                              1x1ptr2-> coefficient2 = s;
                              }
                          }
                          1x1ptr2++;
                          stopindexptr2++;
                      }
                  }
              }
          }
          1x1ptr++;
          stopindexptr++;
      }
  }
}
```

The exact implementation includes many details. Some other implementations of the algorithm can lead to spending much time in table creation. The method presented above is fast, and contains the features explained below:

(1) The outer loops of the algorithm start out like the traditional single-symbol lookup table algorithm. E1 considers the case that a raw coefficient can occur after the first 1 bits. E2 to E3 extracts the run and magnitude of the symbol.

(2) E4 and E5 checks whether a full coefficient follows the first 1 bits.

(3) E6 and E7 obtain the coefficients.

(4) E10 makes sure that even if we cannot obtain the next symbol/coefficient, we can still get all the bit patterns with first bits yielding a coefficient/symbol.

(5) E8–11 ensures that the table creation is fast. Note that without these, the complexity of the algorithm exponentially increases with increasing look ahead bits.

(6) E12–13 is the inner loop. Note that because of E8–11, the complexity is not increased straightaway. E14–15 ensures that we are dealing with the correct subsequent bit pattern.

(7) E16 loops for the next complete coefficient to follow.

(8) E17–18 obtains the second symbol.

(9) E19–20 loops to find if we can obtain the second coefficient straight.
(10) E21–22 obtains the second coefficient.

Note that because of the design of the algorithm, each entry in 0 ... $2^{HUFF\_LOOKAHEAD}-1$ is considered once. This is especially achieved by steps E8–11. The inner loop (starting from E12–13 on) rotates only from the relevant bit position. An example will make this clear. Assume that the current bit pattern at E12 is 1100xxxx, where x means either 0 or 1, and a look ahead of 8 bits. Assume for 1100 we can obtain coefficient y. E8–10 would have filled up all possible 1100xxxx. When E12–13 starts, it correctly considers only xxxx=0000 to 1111. When the outer loop needs to execute again (although it had stopped at 1100 0000), since we took care of the counters in E8–10, it will continue from 1100 1111, correctly.

It is noted that the table creation need be done only once when a new Huffman code is specified.

To supplement the algorithms above, a few simple examples are presented below, using the same simple three-symbol case as presented in the background for the traditional method. Although these examples do not illustrate all of the complexity in the JPEG decode algorithms above, the examples do illustrate the usage of a multi-symbol decode capability. In the traditional VLC decoding example, Table 2 is indexed using a look ahead and allows a single symbol to be decoded with one table access. Table 5 below is indexed using a look ahead of three bits and allows multiple symbols to be decoded in a single table access. For each possible look ahead value, the table records the maximum number of symbols in the look ahead, a list of total codeword lengths for each number of codewords in the look ahead, and a list of decoded symbols for each code word in the look ahead.

TABLE 5

| Look ahead | Number of Symbols | Code Lengths | Symbols |
|---|---|---|---|
| 000 | 1 | {2,—} | {−1,—} |
| 001 | 2 | {2,3} | {−1,0} |
| 010 | 1 | {2,—} | {+1,—} |
| 011 | 2 | {2,3} | {+1,0} |
| 100 | 2 | {1,3} | {0,−1} |
| 101 | 2 | {1,3} | {0,+1} |
| 110 | 2 | {1,2} | {0,0} |
| 111 | 2 | {1,2} | {0,0} |

The example appearing in Table 6 below illustrates decoding the same bitstream (10010101101) as the traditional method, but this time decoding up to two symbols per table access using Table 5. Note the last symbol marked with * hits the end of the bitstream, and therefore a look ahead of three bits could overrun and yield an incorrect second symbol if "X" were to have a value of 1. In this example, four decoding operations are needed in contrast to seven with the example presented in the background. If a larger look ahead is used more than two symbols could be decoded per table look up.

TABLE 6

| | Bitstream | | | |
|---|---|---|---|---|
| | 10010101101 | 10101101 | 01101 | 01 |
| Lookahead | 100 | 101 | 011 | 01X |
| Number of symbols | 2 | 2 | 2 | 1* |
| Code Length(s) | 1, 3 | 1, 3 | 2, 3 | 2, — |
| Symbol(s) | 0, −1 | 0, +1 | +1, 0 | +1 |

A significant issue with multiple symbol decoding is avoiding over-decoding, i.e. decoding more symbols than are present. The number of symbols to decode may be limited externally or a decoded value may indicate a termination. Both of these possibilities are illustrated in the examples below:

In some instances, such as JPEG Huffman decoding, the maximum number of concatenated symbols in a bit stream has an external limit. In such a case, the number of symbols already decoded from the stream can be tracked and the limit can be imposed when needed.

External limit on number of symbols to decode. The number of symbols per decode is limited. The multiple symbol decoding table entries contain information sufficient to obey these constraints while permitting multiple symbol decoding. We consider decoding a motion vector which has two components. If no components have been decoded the limit is two if one component has been decoded, the limit is one. In constructing the table, the limit of two is imposed. The table stores information so the limit of one can be used dynamically as needed.

Basic algorithm:
1) Set limit on number of symbols L
2) Decode multiple symbols N (N<=L)
3) decrease L by the N (L=L−N)
4) if (L>0) go to 2)
5) Done This example uses the same sample VLC table (Table 1) and multiple symbol decoding table (Table 5) as the example above. Consider decoding a motion vector, and consider two example bitstreams 10100001 ... and 0100111 ....

For the first bitstream, a look ahead of three bits is 101. The corresponding table entry has the following properties: two symbols are present, list of total lengths is {1,3} and the list of symbol values is {0,+1}. Both components of the motion vector are decoded (0 and +1) using three bits from the bitstream.

For the bitstream 01001111 ..., a look ahead of three bits is 010. The corresponding table entry has the following properties: one symbol is present, the list of total lengths is {2,−}, and the list of symbol values is {+1,−}. Thus a single symbol with value +1 is decoded using two bits from the bitstream. The resulting bitstream is 0011111 ... It is now known that only one symbol remains from the motion vector. A look ahead of three bits is 001. The corresponding table entry has properties: two symbols are present, list of total lengths {2,3}, and the list of symbol values is {−1,0}. Although the table indicates two symbols are present in the look ahead, since one motion vector component has been decoded only one symbol can be decoded. From the table entries, a single symbol can be decoded using 2 bits and has a value −1. The remaining bitstream is 111111 ... Note that once a lookup table entry is selected, the table entry contains sufficient information to decode different number of symbols as possibly limited by external constraints as in this second example.

The possibility also exists that one of the symbol values indicates the termination of the decoding. This can be factored into the table construction, such that the multiple symbol decoding table never has a terminating symbol strictly inside its list of decoded results.

Basic algorithm:
1) decode multiple symbols
2) if(last symbol decoded !=END) go to 1
3) Done For instance, the VLC code presented in Table 1 could have the following meaning shown in Table 7:

TABLE 7

| Codeword | Symbol |
|---|---|
| 1 | END |
| 01 | +1 |
| 00 | −1 |

Table 8 contains a multiple symbol decoding table indexed using three bit look ahead and limited to two symbols per decode. For each look ahead, the table records, the maximum number of symbols in the look ahead, a list of total codeword lengths for each number of codewords in the look ahead, and a list of decoded symbols for each code word in the look ahead.

TABLE 8

| Lookahead | Number of Symbols | Code Lengths | Symbols |
|---|---|---|---|
| 000 | 1 | {2,—} | {−1,—} |
| 001 | 2 | {2,3} | {−1,END} |
| 010 | 1 | {2,—} | {+1,—} |
| 011 | 2 | {2,3} | {+1,END} |
| 100 | 1 | {1,—} | {END,—} |
| 101 | 1 | {1,—} | {END,—} |
| 110 | 1 | {1,—} | {END,—} |
| 111 | 1 | {1,—} | END,—} |

Note the difference with the multiple symbol table above, specifically that look aheads beginning with an END symbol i.e. 1xx contain only a single decoded symbol.

Other variations on the examples presented above also exist. Some may require that the derived table creation be modified accordingly.

In the coefficient/symbol decoding algorithm presented above for JPEG decoding, the object was to output two complete coefficients if possible, and if not output a coefficient and a symbol, if possible, etc. This hierarchy need not store and check for every one of these possibilities. For instance, the decoding could have been as:

(a) Try to output two symbols
(b) Else try to output one
(c) Else parse tree

Or it could have been as follows:

(a) Try to output one coefficient and one symbol
(b) Else try to output 1 coefficient
(c) Else try to output one symbol
(d) Else parse tree Note that instead of outputting a symbol as run and magnitude, one alternative is to pack them in four bits each and obtain one symbol itself (so that data transfer is faster, but a step will be needed later to obtain these fields separately). Or, as in the illustration above, separate fields can hold run and magnitude, resulting in more data transfer but no additional computations. The implementation can be varied for different processor architectures.

Also, the example above is presented for decoding AC coefficients, but the same idea can be implemented to combine DC and AC prediction. In the latter case, the double lookup will try to output the DC coefficient differential and the first AC coefficient, etc.

The method has been illustrated for double coefficient decoding, but it can be extended to more than 2 coefficients also. The choice of how many symbols can be output from one lookup can depend on the target processor chip, register widths, etc. A decision of the number of look ahead bits and how many symbols/coefficients can be obtained from a lookup can be fixed for a given platform, dependent on platform parameters that can be discovered, or obtained empirically using a test image and trying different choices for a given platform. It is also possible to predict what combination of look ahead bits and number of symbols might work best by examining the image to be decoded at run time. For instance, the file size and image dimensions could be used to calculate the amount of compression in the image, with different combinations of look ahead bits and symbols per lookup for different compression amounts. Table generation could also be simplified for smaller images as the amount of time used to create a more complex table may not be recouped. The codeword distribution in the Huffman table could also be used to decide what combination of look ahead bits and symbols per lookup should be used.

It is also possible to examine the quantization tables inside the stream. If the quantization is low, that fact translates to higher quality. Multiple symbol decoding is more effective when the compression is lower (meaning higher quality). For instance, with a color images the luma and chroma parts of the stream can have different look-ahead number of bits.

The concepts discussed above can also be applied to Progressive JPEG. In that case, the run of coefficients denotes the run across blocks in the image, hence the interpretation of the look up table becomes different.

One use of the present invention is with a television that allows a user to run a variety of Java applets such as JPEG and MPEG browsers, JPEG slide shows or viewers, and MPEG players. The present invention can reduce the amount of processing power used for JPEG or MPEG decoding, thus providing a more pleasurable experience for a user and freeing processing cycles for use by other television features.

Figure 1:
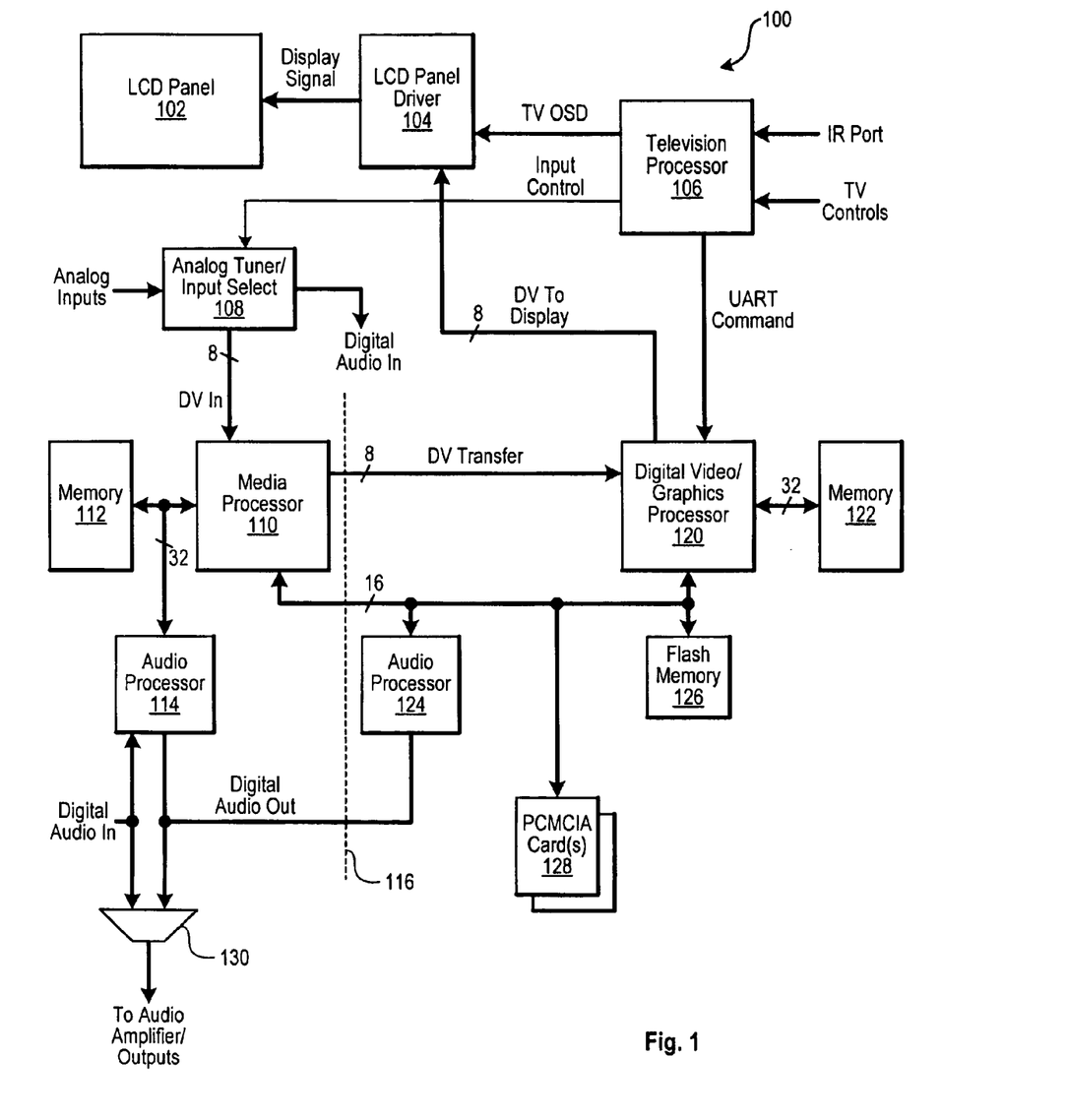
FIG. 1 contains a block diagram for a digital television capable of operating according to some embodiments of the present invention.

FIG. 1 contains a block diagram for a Liquid Crystal Display (LCD) television capable of operating according to some embodiments of the present invention. Television 100 contains an LCD panel 102 to display visual output to a viewer based on a display signal generated by an LCD panel driver 104. LCD panel driver 104 accepts a primary digital video signal in CCIR656 format (eight bits per pixel $YC_bC_r$, in a "4:2:2" data ratio wherein two $C_b$ and two $C_r$ pixels are supplied for every four luminance pixels) from a digital video/graphics processor 120.

A television processor 106 provides basic control functions and viewer input interfaces for television 100. Television processor 106 receives viewer commands, both from buttons located on the television itself (TV controls) and from a handheld remote control unit (not shown) through the IR Port. Based on the viewer commands, television processor 106 controls an analog tuner/input select section 108, and also supplies user inputs to the digital video/graphics processor 120 over a Universal Asynchronous Receiver/Transmitter (UART) command channel. Television processor 106 is also capable of generating basic On-Screen Display (OSD) graphics, e.g., indicating which input is selected, the current audio volume setting, etc. Television processor 106 supplies these OSD graphics, when activated, as a TV OSD signal to LCD panel driver 104 for overlay on the display signal.

Analog tuner/input select section 108 allows television 100 to switch between various analog (or possibly digital) inputs for both video and audio. Video inputs can include a radio frequency (RF) signal carrying standard broadcast television, digital television, and/or high-definition television signals, NTSC video, S-Video, and/or RGB component video inputs, although various embodiments may not accept each of these signal types or may accept signals in other formats (such as PAL). The selected video input is converted to a digital data stream, DV In, in CCIR656 format and supplied to a media processor 110.

Analog tuner/input select section 108 also selects an audio source, digitizes that source if necessary, and supplies that digitized source as Digital Audio In to an audio processor 114 and a multiplexer 130. The audio source can be selected—independent of the current video source—as the audio channel(s) of a currently tuned RF television signal, stereophonic or monophonic audio connected to television 100 by audio jacks corresponding to a video input, or an internal microphone.

Media processor 110 and digital video/graphics processor 120 provide various digital feature capabilities for television 100, as will be explained further in the specific embodiments below. In some embodiments, processors 110 and 120 can be TMS320DM270 signal processors, available from Texas Instruments, Inc., Dallas, Tex. Digital video/graphics processor 120 functions as a master processor, and media processor 110 functions as a slave processor. Media processor 110 supplies digital video, either corresponding to DV In or to a decoded media stream from another source, to digital video/graphics processor 120 over a DV transfer bus.

Media processor 110 performs MPEG (Motion Picture Expert Group) coding and decoding of digital media streams for television 100, as instructed by digital video/graphics processor 120. A 32-bit-wide data bus connects memory 112, e.g., two 16-bit-wide×1M synchronous DRAM devices connected in parallel, to processor 110. An audio processor 114 also connects to this data bus to provide audio coding and decoding for media streams handled by media processor 110.

Dotted line 116 divides the media processor subsystem from the host processor subsystem. Media processor 110 cannot directly access the devices on the right (host) side of dotted line 116. Digital video/graphics processor 120 can access media processor 110 and memory 112 directly, however, and thus indirectly provides connectivity between media processor 110 and flash memory 126 or PCMCIA cards 128.

Digital video/graphics processor 120 coordinates (and/or implements) many of the digital features of television 100. A 32-bit-wide data bus connects memory 122, e.g., two 16-bit-wide×1M synchronous DRAM devices connected in parallel, to processor 120. A 16-bit-wide system bus connects processor 120 to media processor 110, an audio processor 124, flash memory 126, and ports for removable PCMCIA cards 128. Flash memory 126 stores boot code, configuration data, system executable code, and Java code/class files for graphics applications and applets, etc.

Removable device ports for PCMCIA cards 128 can provide extended media and/or application capability for the television, such as Java applets or stored media files. In some embodiments, the removable device port comprises one or two PCMCIA (Personal Computer Memory Card International Association) PC card ports. The PC card and its ports are described in a series of standards dating back to the 1980s—see, for instance, *PC Card Standard* 8.0 Release-April 2001. The PC card interface was developed for laptop computers and other computers that do not provide the large internal card bays (e.g., for Peripheral Component Interconnect cards) of desktop and tower servers. PC cards manufactured today provide Ethernet network interfaces, modems, wireless network interfaces (e.g., IEEE 802.11x), mass storage with micro disk drives or flash memory (CompactFlash), and CompactFlash adapters for other flash formats such as Memory Stick, MultiMedia Card, Secure Digital, SmartMedia, and XD. In some embodiments, applets or media files can be provided to the television by loading the applets or media files to a mass storage device, e.g., from a computer, or purchasing a mass storage device with the applets or media files preloaded, and then connecting the mass storage device to the PC card port. Alternately, with a wireless network interface card inserted in the PCMCIA port, applets or media files stored on a personal computer on the same wireless network can be accessed at the television. Additionally, the television may accept and support other PCMCIA-compatible devices.

Digital video/graphics processor 120 can pass data from the DV Transfer bus to LCD panel driver 104 as is, but processor 120 can also supercede, modify, or superimpose the DV Transfer signal with other content. For instance, processor 120 can generate Java application/applet graphics that overlay or supercede the DV Transfer signal, system graphics that display messages over all underlying content, or decode media from PCMCIA cards 128, e.g., in a "time-shifting" mode where media processor 110 is coding a program to the PCMCIA card and processor 120 decodes and displays a time-shifted version of the same program, allowing the viewer to pause, rewind, or skip through the program.

Multiplexer 130 provides audio output to the television amplifier and line outputs (not shown) from one of three sources. The first source is the current Digital Audio In stream from analog tuner/input select section 108. The second and third sources are the Digital Audio Outputs of audio processors 114 and 124. These two outputs are tied to the same input of multiplexer 130, since each audio processor is capable of tri-stating its output when it is not selected. In some embodiments, processors 114 and 124 can be TMS320VC5416 signal processors, available from Texas Instruments, Inc., Dallas, Tex.

At system powerup, digital video/graphics processor 120 creates an executable image for itself in memory 122 and for media processor 110 in memory 112. Flash memory 126 stores the elements of this image as default system code for processors 110, 114, 120, and 124. This code includes: a system manager, a Java engine, which may contain any combination of a just-in-time Java compiler, a Java interpreter, or precompiled Java code, and a Java manager that manages Java applets for processor 120; audio codecs for processors 114 and 124; and video codecs for processors 110 and 120. The system manager provides low-level functions for communication with the other devices attached to processor 120, and communicates system events to the Java manager and other processes. The Java engine interprets and executes Java code for the Java manager, and Java applets when applets are loaded.

The JPEG and MPEG codecs for processors 110 and 120 are preferably implemented using one of the Huffman-decode embodiments described herein, by building a lookup table into, e.g., memory 122 or internal memory within processor 120. As various applets or applications utilize the codecs, e.g., to create slideshows or thumbnail JPEG browsers, the multiple-Huffman-symbol lookup capability can significantly speed decoding.

What is claimed is:

1. A variable-length-coded (VLC) pattern decoder comprising:
   a VLC lookup table for N index bits, the lookup table having entries comprising, for at least some N-bit lookup table indices, multiple decodable coefficients corresponding to the N index bits; and
   a segment decoder to decode coefficients from a VLC code segment by using N bits from that code segment to locate an entry from the VLC lookup table.

2. The pattern decoder of claim 1, further comprising a table generator to generate the VLC lookup table for a given data source and value of N.

3. The pattern decoder of claim 1, wherein the segment decoder decodes segments of sequential run-length coded, quantized discrete cosine transform coefficients.

4. The pattern decoder of claim 3, wherein for the at least some VLC lookup table entries comprising multiple coefficients, the lookup table entries contain two run lengths and two quantized discrete transform coefficients.

5. The pattern decoder of claim 4, wherein at least one other VLC lookup table entry does not comprise multiple coefficients, but contains a run length and quantized discrete transform coefficient and a following decoded symbol.

6. The pattern decoder of claim 4, wherein at least one other VLC lookup table entry does not comprise multiple coefficients, but contains a run length and quantized discrete transform coefficient.

7. The pattern decoder of claim 1, wherein the VLC lookup table comprises an indication of how many of the N bits from the VLC code segment are consumed by using the VLC lookup table entry corresponding to the N bits from the VLC code segment.

8. The pattern decoder of claim 7, wherein the VLC lookup table comprises a correction to the indication of how many of the N bits from the VLC code segment are consumed by using the VLC lookup table entry corresponding to the N bits from the VLC code segment, and wherein the segment decoder uses the correction to decode less information from the VLC code segment when multiple coefficients do not remain in the code segment.

9. The pattern decoder of claim 1, wherein the segment decoder enforces an external limit on the number of symbols that can exist in a particular N bits, even when the VLC lookup table entry corresponding to those N bits indicates additional coefficients beyond the limit exist in that particular N-bit pattern.

10. The pattern decoder of claim 1, wherein the segment decoder decodes less than all coefficients indicated by a lookup table entry when a coefficient other than the last coefficient in the lookup table entry indicates an end-of-code-segment condition.

11. The pattern decoder of claim 1, wherein the decoder selects the value of N based on at least one parameter selected from the group of parameters consisting of: the size of a register used to hold bits from the VLC code segment; the coding compression of the VLC code segment; the quantization of the VLC code segment; the amount of VLC coded data to be decoded using the VLC lookup table; and combinations thereof.

12. A television receiver comprising:
    a display;
    a VLC pattern decoder having a VLC lookup table for N index bits, the lookup table having entries comprising, for at least some N-bit lookup table indices, multiple decodable coefficients corresponding to the N index bits, and a segment decoder to decode coefficients from a VLC code segment by using N bits from that code segment to locate an entry from the VLC lookup table; and
    display electronics to display viewable content on the display based on coefficients decoded by the VLC pattern decoder.

13. The television receiver of claim 12, comprising a digital video/graphics processor in communication with a memory and the display electronics, wherein the VLC lookup table is stored in the memory and the segment decoder comprises programmable code run by the digital video/graphics processor.

14. The television receiver of claim 12, wherein the viewable content displayed based on the decoded coefficients comprises digital still images.

15. The television receiver of claim 12, wherein the viewable content displayed based on the decoded coefficients comprises digital video.

16. A method of decoding a variable-length coded bitstream, the method comprising:
    selecting a leading N bits from data comprising a VLC code segment;
    locating a matching entry in a VLC lookup table using the leading N bits as an index, the VLC lookup table having entries comprising, for at least some N-bit lookup table indices, multiple decodable coefficients corresponding to the N index bits; and
    decoding, for at least some entries in the VLC lookup table, multiple coefficients from the leading N bits using the located matching entry.

17. The method of claim 16, further comprising generating the VLC lookup table for a given data source and value of N.

18. The method of claim 17, further comprising selecting the value of N based on at least one parameter selected from the group of parameters consisting of: the size of a register used to hold bits from the VLC code segment; the coding compression of the VLC code segment; the quantization of the VLC code segment; the amount of VLC coded data to be decoded using the VLC lookup table; and combinations thereof.

19. The method of claim 16, wherein decoding comprises decoding segments of sequential run-length coded, quantized discrete cosine transform coefficients.

20. The method of claim 19, wherein for the at least some VLC lookup table entries comprising multiple coefficients, the lookup table entries contain two run lengths and two quantized discrete transform coefficients.

21. The method of claim 19, wherein at least one other VLC lookup table entry does not comprise multiple coefficients, but contains a run length and quantized discrete transform coefficient and a following decoded symbol, and wherein decoding comprises decoding a run length, a coefficient, and a following symbol from the leading N bits.

22. The method of claim 19, wherein at least one other VLC lookup table entry does not comprise multiple coefficients, but contains a run length and quantized discrete transform coefficient, and wherein decoding comprises decoding a run length and a coefficient from the leading N bits.

23. The method of claim 16, further comprising determining from the matching entry how many of the N bits from the VLC code segment are consumed by using the VLC lookup table entry corresponding to the N bits from the VLC code segment.

24. The method of claim 23, further comprising determining whether consuming the number of bits indicated by the matching entry causes bits past the end of the VLC code segment to be consumed, and using a correction stored with the matching entry to consume fewer bits and decode less information from the N bits and the matching entry when decoding all coefficients in the matching entry consumes too many bits.

25. The method of claim 16, further comprising enforcing an external limit on the number of symbols that can exist in a particular N bits, even when the VLC lookup table entry corresponding to those N bits indicates additional coefficients beyond the limit exist in that particular N-bit pattern.

26. The method of claim 16, further comprising decoding less than all coefficients indicated by a lookup table entry when a coefficient other than the last coefficient in the lookup table entry indicates an end-of-code-segment condition.

27. An article of manufacture comprising computer-readable media containing computer instructions that, when executed by a processor or group of processors, cause the processor or group of processors to perform a method of decoding a variable-length coded bitstream, the method comprising:

selecting a leading N bits from data comprising a VLC code segment;

locating a matching entry in a VLC lookup table using the leading N bits as an index, the VLC lookup table having entries comprising, for at least some N-bit lookup table indices, multiple decodable coefficients corresponding to the N index bits; and decoding, for at least some entries in the VLC lookup table, multiple coefficients from the leading N bits using the located matching entry.

\* \* \* \* \*